(12) United States Patent
Yoshida

(10) Patent No.: US 8,604,528 B2
(45) Date of Patent: Dec. 10, 2013

(54) FIELD-EFFECT TRANSISTOR, FIELD-EFFECT TRANSISTOR MANUFACTURING METHOD, SOLID-STATE IMAGING DEVICE, AND ELECTRONIC APPARATUS

(75) Inventor: Shinichi Yoshida, Kumamoto (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 13/408,617

(22) Filed: Feb. 29, 2012

(65) Prior Publication Data
US 2012/0228682 A1  Sep. 13, 2012

(30) Foreign Application Priority Data
Mar. 11, 2011  (JP) ................. 2011-054467

(51) Int. Cl.
*H01L 29/78* (2006.01)
*H01L 21/336* (2006.01)
*H01L 27/146* (2006.01)

(52) U.S. Cl.
USPC ........... 257/291; 257/288; 257/E29.255; 257/E27.133; 257/E21.409; 438/283

(58) Field of Classification Search
USPC ........... 257/291, 288, E27.133, E21.409, 257/E29.255, 791, E29.25; 438/283
See application file for complete search history.

(56) References Cited

PUBLICATIONS

Bangsaruntip, S. et al., "High Perfomance and Highly Uniform Gate-All-Around Silicon Nanowire MOSFETs with Wire Size Dependent Scaling" IEDM Tech. Dig., p. 297, 2009.

*Primary Examiner* — Roy Potter
(74) *Attorney, Agent, or Firm* — Rader, Fishman & Grauer PLLC

(57) ABSTRACT

According to the present disclosure, it is possible to further miniaturize the gate electrode of the field-effect transistor. The field-effect transistor includes a substrate; a semiconductor layer configured to be formed on the substrate and have a fin region formed thereon with a source region and a drain region formed at both ends of the fin region; and a gate electrode configured to have a convex portion partially in contact with at least two faces of the fin region.

9 Claims, 11 Drawing Sheets

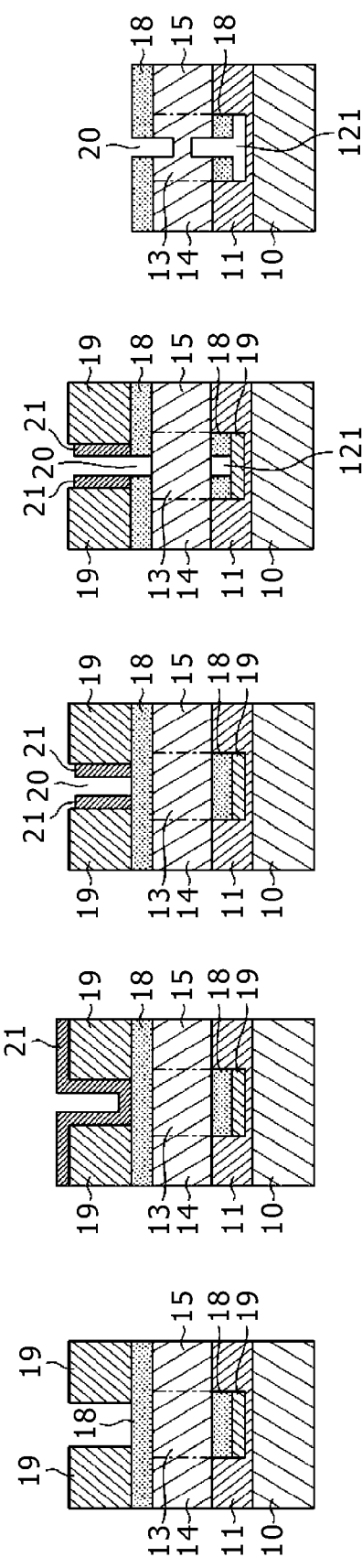

FIG.12A  FIG.12B  FIG.12C
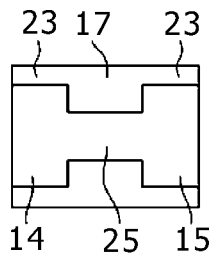 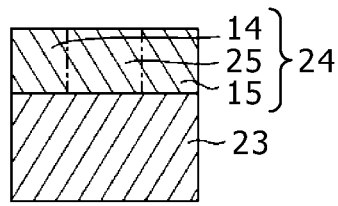 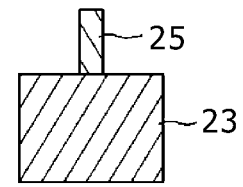
FIG.13A  FIG.13B  FIG.13C
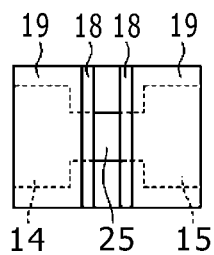 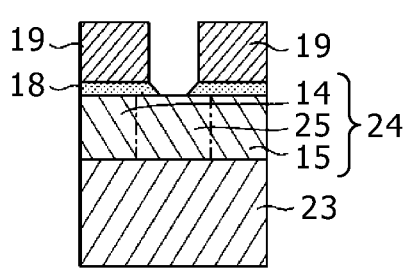 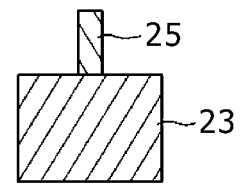
FIG.14A  FIG.14B  FIG.14C
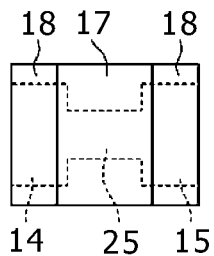 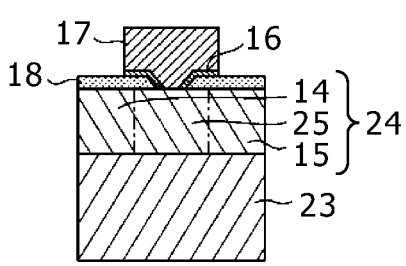 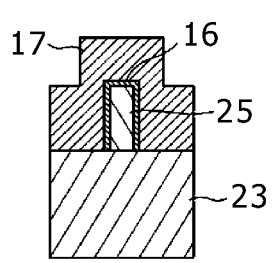

FIELD-EFFECT TRANSISTOR, FIELD-EFFECT TRANSISTOR MANUFACTURING METHOD, SOLID-STATE IMAGING DEVICE, AND ELECTRONIC APPARATUS

BACKGROUND

The present disclosure relates to a field-effect transistor, a field-effect transistor manufacturing method, a solid-state imaging device, and an electronic apparatus.

Recent years have witnessed progressive refinement of the semiconductor manufacturing technology. This has entailed the problem of increasing off-current due to what is known as the short channel effect in the ordinary planar type transistor structure. As a countermeasure against this problem, studies have been underway to implement a so-called multi-gate structure. This is a structure designed to inhibit the short channel effect using three-dimensional channel regions that enhance the electrostatic control capability of gate electrodes. Explained below in reference to FIGS. 17 through 18B are the major differences between the planar type transistor structure and the multi-gate structure. FIG. 17 shows a typical planar type field-effect transistor, and FIGS. 18A and 18B indicate a field-effect transistor having a fin structure that is one example of the multi-gate structure.

The planar type field-effect transistor shown in FIG. 17 includes a silicon substrate 330, a gate electrode 332 formed on the silicon substrate 330 with a gate insulating file 331 interposed therebetween, and a source region 333 and a drain region 334 formed on the silicon substrate 330 with the gate electrode 332 interposed therebetween.

When an electric field is applied from the gate electrode 332 of the planar type field-effect transistor, a current corresponding to the magnitude of the applied electric field flows the transistor.

FIG. 18A is a perspective view of a fin-structure field-effect transistor, and FIG. 18B is a cross-sectional view of this fin-structure field-effect transistor.

The fin-structure field-effect transistor generally has an insulating layer 340 formed on a substrate (not shown), and an SOI layer that has a source region 341 and a drain region 342 formed with a fin region 343 interposed therebetween on the insulating layer 340. Furthermore, the fin-structure field-effect transistor has a gate electrode 344 formed in a manner surrounding the fin region 343 so that electric fields may be applied thereto in two directions as shown in FIG. 18B.

The fin-structure field-effect transistor above inhibits the short channel effect because it offers the ability to better control currents than the planar type field-effect transistor that has the electric field applied thereto only in one direction.

In addition to the above-outlined fin structure, examples of the multi-gate structure include the tri-gate structure in which electric fields are applied in three directions and the nanowire structure in which the fin region is totally covered with the gate electrode as disclosed by S. Bangsaruntip, et al., IEDM Tech. Dig., p. 297, (2009).

SUMMARY

The planar type field-effect transistor has its gate electrode formed on a planar surface, whereas the multi-gate structure field-effect transistor has its gate electrode formed on a concave-convex surface composed of the substrate and fin region. The presence of the concave-convex surface makes it difficult to finely manufacture the gate electrode of the multi-gate structure field-effect transistor.

The present disclosure has been made in view of the above circumstances and provides a field-effect transistor designed so that its gate electrode is finely manufactured, and a method for manufacturing such a transistor.

The present disclosure also provides a solid-state imaging device equipped with such a field-effect transistor, and an electronic apparatus furnished with such a solid-state imaging device.

According to one embodiment of the present disclosure, there is provided a field-effect transistor including a substrate; a semiconductor layer configured to be formed on the substrate and have a fin region formed thereon with a source region and a drain region formed at both ends of the fin region; and a gate electrode configured to have a convex portion partially in contact with at least two faces of the fin region.

Because the gate electrode has the convex portion, it is possible to further miniaturize the gate electrode in contact with the fin region.

According to another embodiment of the present disclosure, there is provided a field-effect transistor manufacturing method including: manufacturing a semiconductor layer having a fin region formed on a substrate with a source region and a drain region formed at both ends of the fin region; manufacturing a film having an etching selection ratio with respect to the semiconductor layer so that the film is in contact with at least two faces of the fin region; manufacturing an opening so that at least two faces of the fin region of the film are partially exposed; and manufacturing a gate electrode in contact with the fin region with the film interposed therebetween.

According to a further embodiment of the present disclosure, there is provided a solid-state imaging device including a pixel portion configured to generate a signal charge by having incident light received and subjected to photoelectric conversion; and a peripheral circuit configured to output the signal charge; wherein at least either the pixel portion or the peripheral circuit has the above-outlined field-effect transistor.

According to an even further embodiment of the present disclosure, there is provided an electronic apparatus including the above-outlined solid-state imaging device, an optical lens, and a signal processing circuit.

According to the present disclosure embodied as outlined above, it is possible to further miniaturize the gate electrode of the field-effect transistor having the multi-gate structure.

BRIEF DESCRIPTION OF THE DRAWINGS

FIGS. 10A, 10B, 10C, 10D and 10E are schematic views showing processes of manufacturing a solid-state imaging device incorporating a first variation of the first embodiment:

FIGS. 12A, 12B and 12C are schematic views showing processes of manufacturing the field-effect transistor as the second embodiment;

FIGS. 13A, 13B and 13C are schematic views showing processes of manufacturing the field-effect transistor as the second embodiment;

FIGS. 14A, 14B and 14C are schematic views showing processes of manufacturing the field-effect transistor as the second embodiment;

DETAILED DESCRIPTION OF THE PREFERRED EMBODIMENTS (First Embodiment)

Figure 1A:
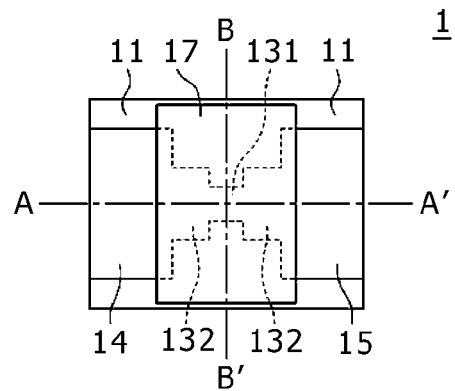
FIGS. 1A, 1B and 1C are schematic views showing a field-effect transistor as a first embodiment of the present disclosure.
Figure 1B:
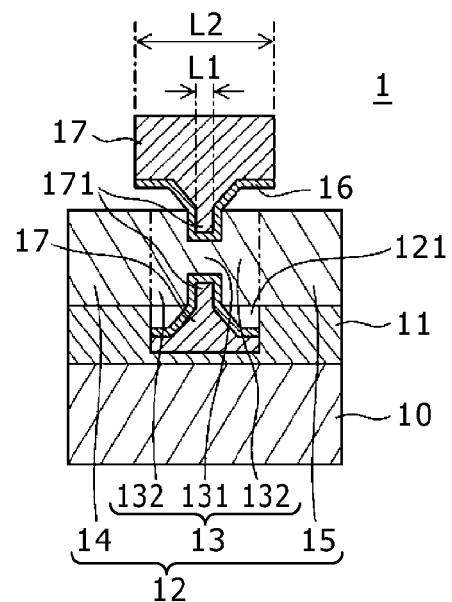
Figure 1C:
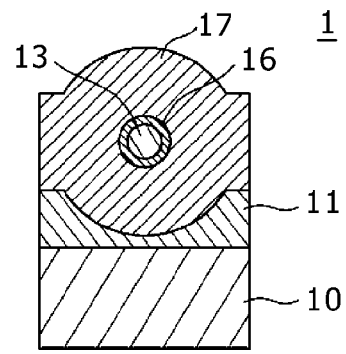

FIGS. 1A, 1B and 1C are schematic views showing a field-effect transistor 1 as the first embodiment of the present disclosure. What follows is an explanation of the field-effect transistor 1 having a nanowire structure as one example of the multi-gate structure.

FIG. 1A is a plan view of the field-effect transistor 1. FIG. 1B is a cross-sectional view taken along segment A-A' in FIG. 1A. FIG. 1C is a cross-sectional view taken along segment B-B' in FIG. 1A.

The field-effect transistor 1 shown in FIGS. 1A to 1C are made up of an SOI substrate 10, an insulating film (BOX layer) 11, and an SOI layer 12 stacked in that order.

The SOI layer 12 is a semiconductor layer that has a fin region 13 with a source region 14 and a drain region 15 formed at both ends thereof.

A gate electrode 17 is partially in contact with the fin region 13 with a gate insulating film 16 interposed therebetween so that at least two faces (4 faces in this example) of the fin region 13 are surrounded by the gate electrode 17.

The fin region 13 of the SOI layer 12 has the nanowire structure that is smaller in line thickness than the source region 14 or drain region 15. The fin region 13 has a first wire portion 131 in contact with the gate electrode 17 with the gate insulating film 16 interposed therebetween, and a second wire portion 132 having a clearance from the gate electrode 17 and not in contact therewith. The first wire portion 131 is smaller in thickness than the second wire portion 132.

That are of the fin region 13 which is in contact with the gate electrode 17, i.e., the first wire portion 131, is called a channel region. The channel length of the channel region is substantially equal to the first wire portion 131.

The insulating film 11 has a concave portion 121 formed corresponding to the underside of the fin region 13. The gate electrode 17 may also be formed within the concave portion 121 in a manner surrounding the fin region 13. The gate electrode 17 has a circular inner periphery that surrounds the fin region 13.

The gate electrode 17 has a convex portion 171 in contact with the first wire portion 131 of the fin region 13 with the gate insulating film 16 interposed therebetween. The convex portion 171 is positioned approximately in the middle of the first wire portion 131 in the line direction thereof (crosswise in FIG. B) over the entire inner periphery surrounding the fin region 13 in a manner protruding inside (i.e., toward the center of a circular sectional shape of the inner periphery).

The convex portion 171 has an approximately tapered shape of which the width on the side of the first wire portion 131 (i.e., inside) is smaller than the width on the side of the gate electrode 17. That is, the gate electrode 17 has a tapered shape such that the width L1 of a first face thereof in contact with the first wire portion 131 of the fin region 13 is smaller than the width L2 of a second face thereof opposite to the first face (L1<L2). With the convex portion 171 in place, the gate electrode 17 is in contact with the fin region 13 in an area narrower than the line thickness of the gate electrode 17.

The method for manufacturing the field-effect transistor 1 is explained below in reference to FIGS. 2A through 7C. FIGS. 2A, 3A, 4A, 5A, 6A and 7A are plan views of processes in which the field-effect transistor 1 is manufactured. FIGS. 2B, 3B, 4B, 5B, 6B and 7B are cross-sectional views taken along segment A-A' in FIG. 1A. FIGS. 2C, 3C, 4C, 5C, 6C and 7C are cross-sectional views taken along segment B-B' in FIG. 1A.

Figure 2A:
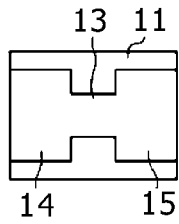
FIGS. 2A, 2B and 2C are schematic views showing processes of manufacturing the field-effect transistor as the first embodiment.
Figure 2B:
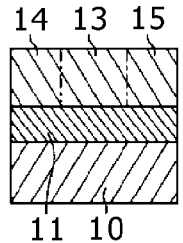
Figure 2C:
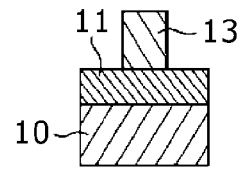

First, the insulating film 11 is formed on the SOI layer 10 as shown in FIGS. 2A, 2B and 2C. Then photo-lithography/dry etching techniques are used to form the SOI layer 12 that has on the insulating film 11 a rectangular fin region 13 formed to have substantially the same width as the second wire portion 132, and the source region 14 and drain region 15 formed at both ends of the fin region 13.

Figure 3A:
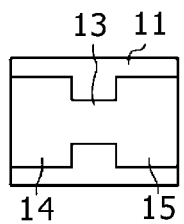
FIGS. 3A, 3B and 3C are schematic views showing processes of manufacturing the field-effect transistor as the first embodiment.
Figure 3B:
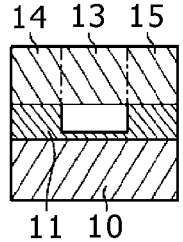
Figure 3C:
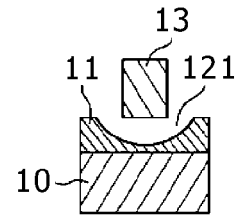

As shown in FIGS. 3A, 3B and 3C, the insulating film 11 in contact with the fin region 13 is removed by isotropic etching using DHF (diluted hydrofluoric acid), whereby the concave portion 121 is formed in the insulating film 11. This process exposes the perimeter of the fin region 13. Although a wet etching process utilizing DHF is used here as one way of forming the concave portion 121 in connection with the first embodiment, this is not limitative of the present disclosure. As another example, a dry etching process under isotropic etching conditions may be adopted to form the concave portion 121.

Figure 4A:
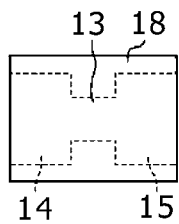
FIGS. 4A, 4B and 4C are schematic views showing processes of manufacturing the field-effect transistor as the first embodiment.
Figure 4B:
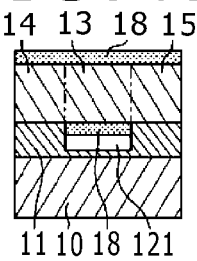
Figure 4C:
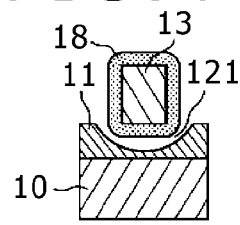

A film 18 made of SiN (called the SiN film hereunder) is formed on the exposed surface of the SOI layer 12 as shown in FIGS. 4A, 4B and 4C. Although SiN is cited here as the material with which to form the film 18 in connection with the first embodiment, this is not limitative of the present disclosure. Other suitable materials having an appropriate etching selection ratio with respect to silicon such as the SOI layer 12 may be utilized, such as SiO or SiON. Furthermore, the SiN film 18 need not be a single layer; the film 18 may be a film formed by SiN and SiO layers stacked therein.

The SiN film 18 may be formed typically on condition that gases such as $SiH_4$, $NH_3$ and $H_2$ be used, that the RF power range from 100 W to 3000 W, and that the pressure range from 0.001 Torr to 50 Torr. When these film-forming conditions are observed in controlling film stress, the stress is applied to the fin region 13 so as to facilitate the migration of carriers through the fin region 13. Specifically, if the Si surface of the SOI layer is the Si(100) surface and if the field-effect transistor 1 is an N-type transistor, then the SiN film 18 is formed in such a manner that a tensile stress is applied to the fin region 13 in parallel with the current direction. If the field-effect transistor 1 is a P-type transistor, then the SiN film 18 is formed so that a compressive stress is applied to the fin region 13 in parallel with the current direction.

Figure 5A:
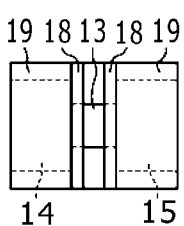
FIGS. 5A, 5B and 5C are schematic views showing processes of manufacturing the field-effect transistor as the first embodiment.
Figure 5B:
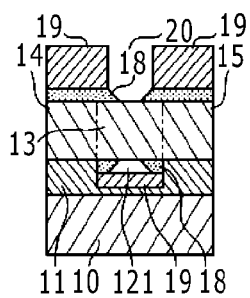
Figure 5C:
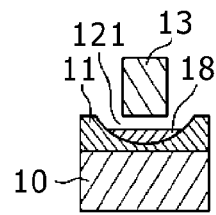

A photo-resist 19 having an opening as shown in FIGS. 5A, 5B and 5C is then formed on the SiN film 18. Using the photo-resist 19 as a mask, the SiN film 18 is dry-etched to form an opening portion 20 exposing the perimeter of the fin region 13 (see FIG. 5B). This photo-resist dry-etching process may be performed using CHxFy, NFx and O2, for example, under conditions conducive to producing deposits such as a high pressure of at least 100 mTorr and a low bias ranging from 0 W to 50 W.

Figure 8A:
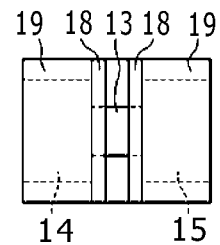
FIGS. 8A, 8B, 8C, 8D and 8E are schematic views showing processes of manufacturing the field-effect transistor as the first embodiment.
Figure 8B:
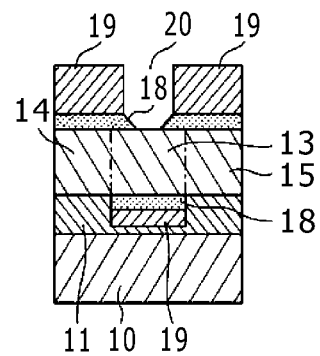
Figure 8C:
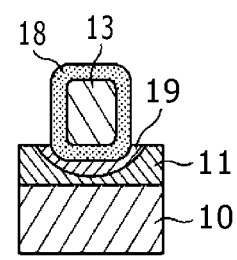
Figure 8D:
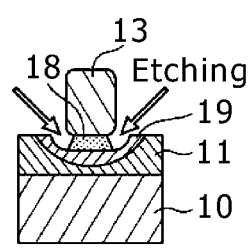
Figure 8E:
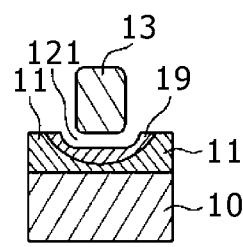

Explained below in reference to FIGS. 8A through 8E are detailed processes in which the opening portion 20 is formed in the SiN film 18. FIG. 8A is a plan view of the field-effect transistor 1 in effect before the opening portion 20 is formed. FIG. 8B is a cross-sectional view taken along segment A-A' in FIG. 1A. FIGS. 8C through 8E are cross-sectional views each taken along segment B-B' in FIG. 1A and showing dry-etching processes.

As shown in FIGS. 8A through 8C, the photo-resist 19 is formed except where the opening portion 20 is provided. Because the photo-resist 19 immediately below the fin region 13 cannot be exposed to light, the photo-resist 19 on the insulating film 11 is left unremoved.

Although the photo-resist 19 remains between the insulating film 11 and the fin region 13, the opening portion 20 is formed in the SiN film 18 immediately below the fin region 13 by side etching during the dry-etching process, as shown in FIGS. 8D and 8E.

Returning to FIGS. 5A through 5C, the opening portion 20 formed by the above-explained processes has a tapered shape that becomes narrower towards the fin region 13, as shown in the cross-sectional view of FIG. 5B. The shape of the opening portion 20 determines a channel length of the field-effect transistor 1. The channel length will be discussed later in detail.

Figure 6A:
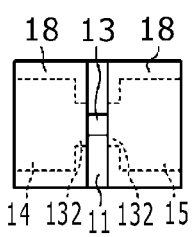
FIGS. 6A, 6B and 6C are schematic views showing processes of manufacturing the field-effect transistor as the first embodiment.
Figure 6B:
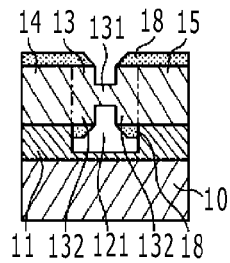
Figure 6C:
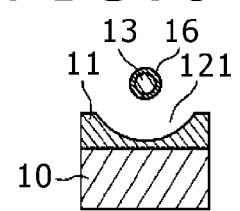

Then the photo-resist 19 is removed as shown in FIGS. 6A through 6C. Thereafter, the hydrogen anneal process and oxidation treatment are performed to smooth out partially the perimeter of the fin region 13, whereby the fin region 13 is partially made smaller in thickness. The thinned part of the fin region 13 becomes the first wire portion 131, and the rest becomes the second wire portion 132.

The hydrogen anneal process may be carried out at 800° C. in a hydrogen atmosphere for example. The oxidation treatment may be performed at 1000° C. in an oxygen atmosphere for example. Instead of resorting to the above-mentioned techniques, the fin region 13 may be thinned using a low-damage wet process or CDE (chemical dry etching).

Figure 7A:
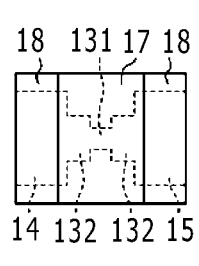
FIGS. 7A, 7B and 7C are schematic views showing processes of manufacturing the field-effect transistor as the first embodiment.
Figure 7B:
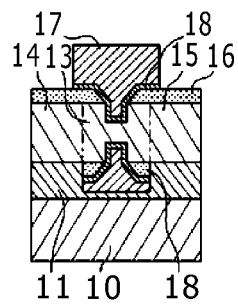
Figure 7C:
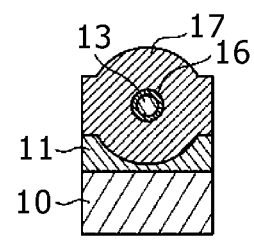

The gate insulating film 16 and gate electrode 17 are formed on the surfaces of the SiN film 18 and of the first wire portion 131, as shown in FIGS. 7A through 7C. Since the channel length was determined when the opening portion 20 was formed in the SiN film 18, no fine pattern is required upon manufacturing of the gate.

The materials for making the gate insulating film 16 may be such oxides as Si (silicon), Hf (hafnium), Ta (tantalum), Ti (titanium), Zr (zirconium), La (lanthanum), and Al (aluminum). The materials for forming the gate electrode 17 may be such metals as polysilicon, TiN (titanium nitride), and TaN (tantalum nitride). The gate electrode 17 may be formed using ALD (atomic layer deposition) or CVD (chemical vapor deposition) characterized by good coverage.

The SiN film 18 is then removed. This provides the field-effect transistor 1 shown in FIGS. 1A through 1C. The processes for forming contacts and wires are the same as those in traditional manufacturing and thus will not be discussed hereunder.

Figure 9:
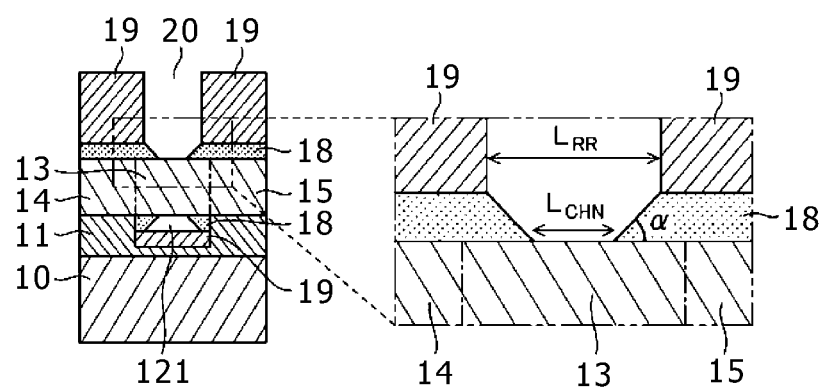
FIG. 9 is a magnified view of the field-effect transistor as the first embodiment.

The channel length is explained below in detail with reference to FIG. 9. FIG. 9 is a magnified view of the opening portion 20 indicated in FIG. 5B.

If it is assumed that $L_{PR}$ stands for the line thickness determined by the photo-resist 19 (i.e., width of the opening of the photo-resist 19), $L_{CHN}$ for the channel length, and $\alpha$ (°) for the taper angle of the opening portion 20 in the SiN film, then the following expression (1) holds true:

$$L_{CHN}=L_{PR}-2\times(\text{film thickness of SiN film 18/tan}\alpha) \quad (1)$$

As explained above, when the taper-shaped opening portion 20 is formed in the SiN film 18, it is possible to make the channel length $L_{CHN}$ smaller than the line thickness $L_{PR}$ determined by the photo-resist 19. For example, if the film thickness of the SiN film is 100 nm and the taper angle $\alpha$ is 80°, the channel length $L_{CHN}$ is made to be 10 nm when the line thickness determined by the photo-resist 19 is enlarged up to 43.3 nm. That is, even when the opening of the photo-resist 19 is wide, the channel length $L_{CHN}$ can be made smaller than before.

According to the field-effect transistor of the above-described first embodiment, the gate electrode 17 in contact with the fin region 13 can be made smaller by having part of the gate electrode 17 formed into the convex portion 171.

Also, when the gate electrode 17 is formed, the fin region 13 is covered with the SiN film 18. This renders the fin region 13 resistant to etching damage, which helps inhibit current leaks and an increase of the interface state attributable to etching damage. When covered with the SiN film 18, the fin region 13 is protected against pattern destruction such as the breaking of wires. Furthermore, the fin region 13 is formed so that the first wire portion 131 in contact with the gate electrode 17 is smaller in thickness than the second wire portion 132. In other words, the fin region 13 in the nanowire structure is formed so that the first wire portion 131 smaller in thickness than the second wire portion 132 is furnished partially in the line direction of the wire portions. This in turn reduces those portions of the fin region 13 which are miniaturized to the extreme, whereby pattern destruction of the fin region 13 is inhibited.

With regard to the first embodiment described above, the SiN film 18 was shown removed after the gate electrode 17 has been formed. Alternatively, the SiN film 18 may be left unremoved. If the SiN film 18 is left intact, the film stress of the SiN film 18 may be controlled so as to apply stress to the channel region, whereby the migration of carriers is promoted.

(First Variation)

With the first embodiment above, the method for providing the opening portion 20 in the SiN film 18 was shown to be photo-resist dry-etching. Alternatively, the resist shrink technique involving the use of a low-temperature oxide film may be utilized. How to apply this technique is explained below in reference to FIGS. 10A through 10E.

The processes for forming the photo-resist 19 on the SiN film 18 as shown in FIG. 10A are the same as those indicated in FIGS. 5A through 5C. With this first variation, an oxide film 21 is formed on the photo-resist 19 at low temperature (FIG. 10B). The oxide film 21 is then etched back to form an opening portion 22 smaller than the opening of the photo-resist 19 (FIG. 10C).

Using the photo-resist 19 and oxide film 21 as a mask, the SiN film 18 is dry-etched to form the opening portion 20 therein (FIG. 10D). Because the photo-resist 19 immediately below the fin region 13 cannot be exposed to light as shown in FIGS. 10B and 10C, there is no opening in the photo-resist 19 on the insulating film 11. Thus neither the oxide film 21 nor the opening portion 22 is formed. As explained above, however, side etching during the dry etching process is used to form the opening portion 20 in the SiN film 18 immediately below the fin region 13.

Although not tapered in shape, the opening portion 20 of the SiN film 18 may be formed in the SiN film 18 in a manner smaller than the opening of the photo-resist 19 thanks to the use of the oxide film 21.

(Second Embodiment)

What follows is an explanation of a field-effect transistor 2 as the second embodiment of the present disclosure. The field-effect transistor 2 of the second embodiment has a fin structure that is different from the nanowire structure of the first embodiment. In the ensuing description, the components substantially the same as those of the first embodiment are designated by the same reference numerals, and their explanations are omitted.

Figure 11A:
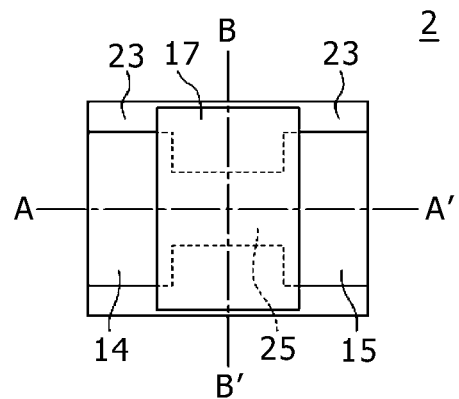
FIGS. 11A, 11B and 11C are schematic views showing a field-effect transistor as a second embodiment of the present disclosure.
Figure 11B:
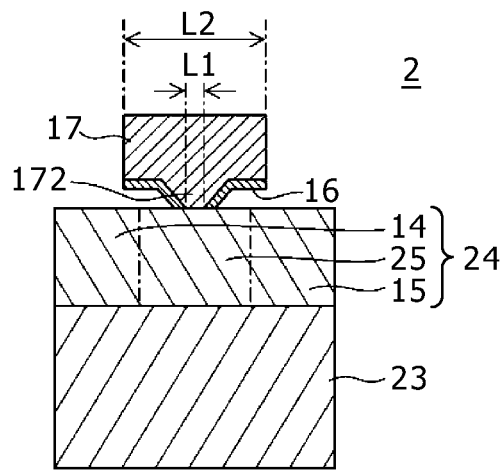
Figure 11C:
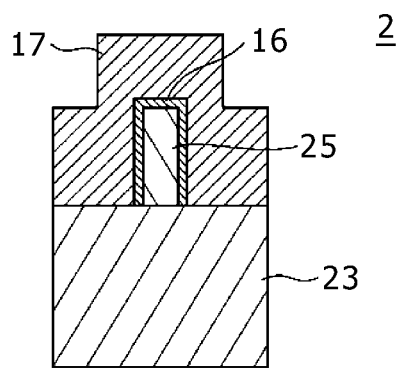

FIG. 11A is a plan view of the field-effect transistor 2 as the second embodiment. FIG. 11B is a cross-sectional view of the field effect transistor 2 taken along segment A-A' in FIG. 11A. FIG. 11C is a cross-sectional view of the field-effect transistor 2 taken along segment B-B' in FIG. 11A.

The field-effect transistor 2 has a silicon substrate 23 and an SOI layer 24 formed on the silicon substrate 23. The SOI layer 24 is a semiconductor layer that has a fin region 25, and a source region 14 and a drain region 15 formed at both ends of the fin region 25.

The field-effect transistor 2 includes a gate electrode 17 that has a convex portion 172 partially in contact with at least two faces of the fin region 25 with a gate insulating film 16 interposed therebetween. The convex portion 172 is a protrusion made progressively smaller downward on the side of the SOI layer 24.

Because the field-effect transistor 2 has the fin structure, electrical fields are applied thereto in at least two directions as mentioned above. Thus the gate electrode 17 is in contact with at least two faces of the fin region 25 to which electrical fields are applied, with the gate insulating film 16 interposed therebetween. With the second embodiment, the gate electrode 17 is in contact with three faces of the fin region 25 with the gate insulating film 16 interposed therebetween, the bottom face of the fin region 25 being the exception that is in contact with the silicon substrate 23.

With the second embodiment, the convex portion 172 of the gate electrode 17 is in contact with the fin region 25. That means the gate electrode 17 is in contact with the fin region 25 at a portion smaller than the width between the source region 14 and the drain region 15. That is, the taper-shaped tip of the convex portion 172 has a size smaller than the dimension between the source region 14 and the drain region 15. Specifically, the convex portion 172 of the gate electrode 17 is tapered so that the width L1 of a first face thereof in contact with the fin region 13 is smaller that the width L2 of a second face thereof opposite to the first face (L1<L2). The gate electrode 17 with its convex portion 172 is partially in contact with the fin region 25 interposed between the source region 14 and the drain region 15 in the SOI layer 24.

The processes for manufacturing the field-effect transistor 2 are explained below in reference to FIG. 12A through FIG. 14C. FIGS. 12A, 13A and 14A are plan views of the field-effect transistor 2 being processed. FIGS. 12B, 13B and 14B are cross-sectional views each taken along segment A-A' in FIG. 11A. FIGS. 12C, 13C and 14C are cross-sectional views each taken along segment B-B' in FIG. 11A.

On the silicon substrate 23, as shown in FIGS. 12A through 12C, the SOI layer 24 is formed using photo-lithography/dry-etching techniques in such a manner as to include a rectangular fin region 25 as well as the source region 14 and drain region 15 formed at both ends of the fin region 25.

As shown in FIGS. 13A through 13C, the SiN film 18 is formed on the fin region 25. Then a photo-resist 19 having an opening is formed on the SiN film 18. Using the photo-resist 19 as a mask, the SiN film 18 is dry-etched to form an opening portion 20 in such a manner that at least two faces of the fin region 25 are partially exposed. As with the first embodiment, the opening portion 20 is taper-shaped.

After the photo-resist 19 is removed, the gate insulating film 16 and gate electrode 17 are formed. Since the taper-shaped opening portion 20 is formed in the SiN film 18, the gate electrode 17 has a tapered convex portion 172 formed corresponding to the shape of the opening portion 20. After the gate electrode 17 is formed, the SiN film 18 is removed to provide the field-effect transistor 2 shown in FIGS. 11A through 11C.

According to the field-effect transistor of the second embodiment, as explained above, the gate electrode 17 is partially formed as the convex portion 172. This arrangement miniaturizes the gate electrode 17 in contact with the fin region 25 even on the field-effect transistor of the fin structure.

Although the SiN film 18 was shown removed after the gate electrode 17 has been formed for the second embodiment, this is not limitative of the present disclosure. Alternatively, the SiN film 18 may be left unremoved. If the SiN film is to be left intact, the film stress of the SiN film 18 may be controlled so as to apply stress to the channel region, whereby the migration of carriers is appreciably promoted.

Although the substrate of the field-effect transistor 2 is shown as the silicon substrate 23 in FIGS. 11A through 11C, an SOI substrate may replace the silicon substrate 23. In this case, an insulating film is formed between the SOI substrate and the SOI layer.

(Third Embodiment)

Figure 15:
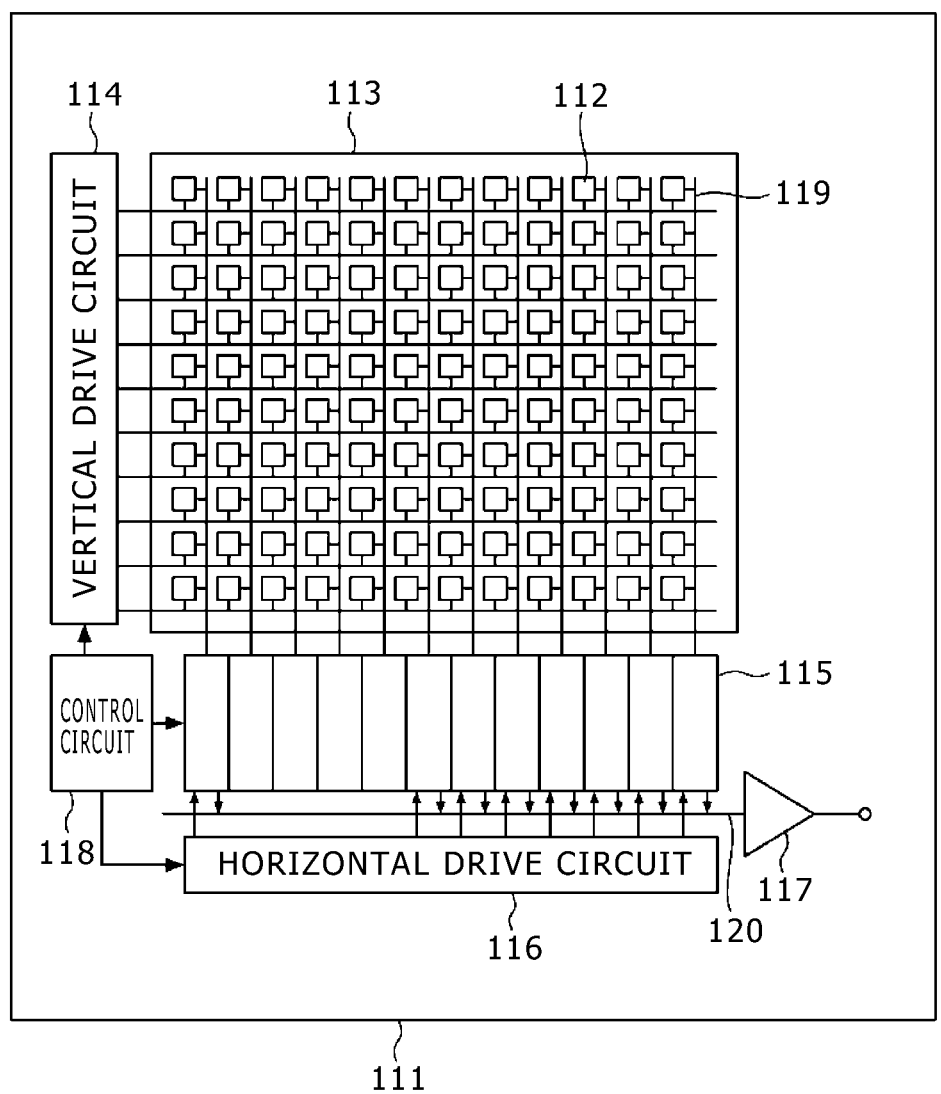
FIG. 15 is a schematic view showing a solid-state imaging device as a third embodiment of the present disclosure.

Explained below as the third embodiment is an application of the field-effect transistor 1. FIG. 15 is a schematic view showing a solid-state imaging device 100 that uses the field-effect transistor 1 indicated in FIGS. 1A through 1C. The solid-state imaging device 100 in FIG. 15 is composed of a substrate 111 made of silicon, a pixel portion 113 having a plurality of pixels 112 arrayed on the substrate 111, a vertical drive circuit 114, column signal processing circuits 115, a horizontal drive circuit 116, an output circuit 117, and a control circuit 118. Except for the pixel portion 113, the circuits such as the vertical drive circuit 114, column signal processing circuits 115, horizontal drive circuit 116, output circuit 117, and control circuit 118 may be generically called peripheral circuits. The pixel portion 113 has incident light received and subjected to photoelectric conversion so as to generate a signal charge. The peripheral circuits output the signal charge generated by the pixel portion 113.

The pixel portion 113 has a plurality of pixels 112 arranged regularly in a two-dimensional array. The pixel portion 113 is composed of two regions: an effective pixel region that actually receives incident light, turns it into a signal charge through photoelectric conversion, amplifies the signal charge thus generated, and forwards the amplified signal charge to the column signal processing circuits 115; and a black reference pixel region (not shown) that outputs an optical black serving as the black level reference. The black reference pixel region is usually formed along the circumference of the effective pixel region.

Each pixel 112 may be typically constituted by a photoelectric conversion element (e.g., photodiode, not shown) and a plurality of pixel transistors (not shown). A plurality of pixels 112 are arranged regularly in a two-dimensional array on a substrate 11. The multiple pixel transistors may be made up of four transistors consisting of a transfer transistor, a reset transistor, a selection transistor, and am amplifier transistor; or three transistors composed of the four minus the selection transistor. The field-effect transistor 1 of the nanowire structure shown in FIGS. 1A through 1C is used as each of these transistors.

Based on a vertical synchronization signal, a horizontal synchronization signal and a master clock signal, the control circuit 118 generates clock and control signals serving as the reference for the vertical drive circuit 114, column signal processing circuits 115, and horizontal drive circuit 116 to operate on. Using the clock and control signals, the control circuit 118 controls the vertical drive circuit 114, column signal processing circuits 115 and horizontal drive circuit 116.

The vertical drive circuit 114, typically composed of shift registers, scans the pixels 112 in increments of lines selectively and sequentially in the vertical direction. The vertical drive circuit 114 feeds a pixel signal based on the signal charge generated in proportion to the amount of light received by the photoelectric conversion element of each pixel 112, to the corresponding column signal processing circuit 115 through a vertical signal line 119.

The column signal processing circuit 115 may be positioned for each column of the pixels 112 for example. As such, the column signal processing circuit 115 performs such signal processes as noise removal and signal amplification on the signal output from each row of pixels 112 per pixel column in reference to the signal from the black reference pixel region. In the output stage of each column signal processing circuit 115, a horizontal selection switch (not shown) is provided between the circuit 115 and a horizontal signal line 120.

The horizontal drive circuit 116 may be composed of shift registers for example. The horizontal drive circuit 116 selects one column signal processing circuit 115 after another by sequentially outputting horizontal scan pulses. In this manner, the horizontal drive circuit 116 causes each column signal processing circuit 115 to output its pixel signal onto the horizontal signal line 120.

The output circuit 117 performs signal processing on the pixel signals supplied sequentially from the column signal processing circuits 115 via the horizontal signal line 120, and outputs the processed pixel signals to an external apparatus, not shown.

The transistors possessed by at least part of the peripheral circuits such as the horizontal selection switch and horizontal drive circuit 116 are each composed of the field-effect transistor 1 of the nanowire structure shown in FIG. 1.

As described above, the solid-state imaging device 100 has its circuitry made up of the field-effect transistors 1 shown in FIG. 1. Because the circuits are composed of field-effect transistors of which the gate electrode is made smaller than before, it is possible to enhance the current control capability and other features afforded the field-effect transistors. That in turn improves the performance of the solid-state imaging device 100.

A CMOS solid-state imaging device was explained above as an example of the solid-state imaging device 100. Alternatively, it is obvious that the circuitry of a CCD solid-state imaging device can also be implemented effectively using the field-effect transistor 1 shown in FIGS. 1A through 1C.

The preceding example showed the solid-state imaging device 100 to be furnished with the field-effect transistor 1 of the first embodiment. Alternatively, the solid-state imaging device 100 may be provided with the field-effect transistor of the first variation or of the second embodiment.

(Fourth Embodiment)

Figure 16:
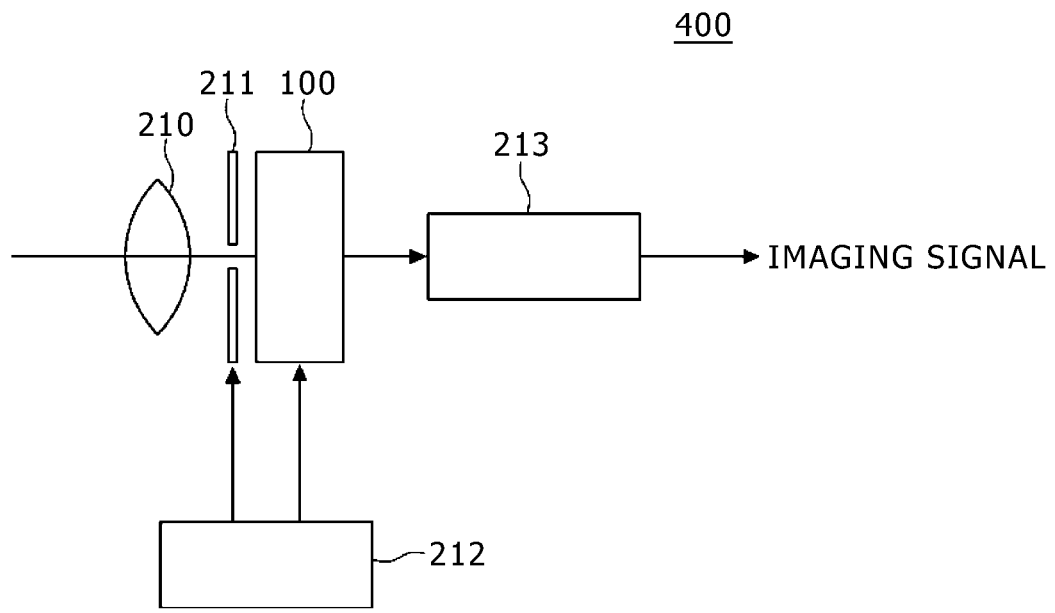
FIG. 16 is a schematic view showing an electronic apparatus as a fourth embodiment of the present disclosure.
Figure 17:
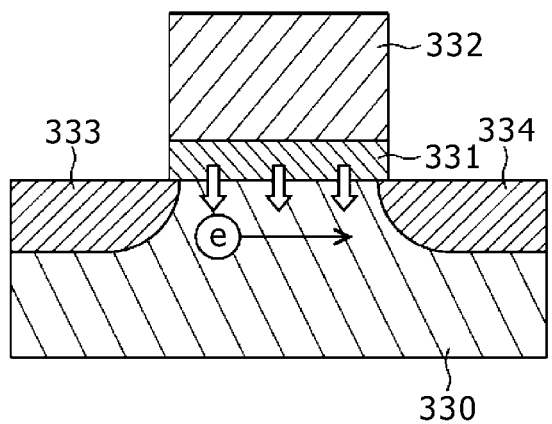
FIG. 17 is a schematic view showing a planar type field-effect transistor.
Figure 18A:
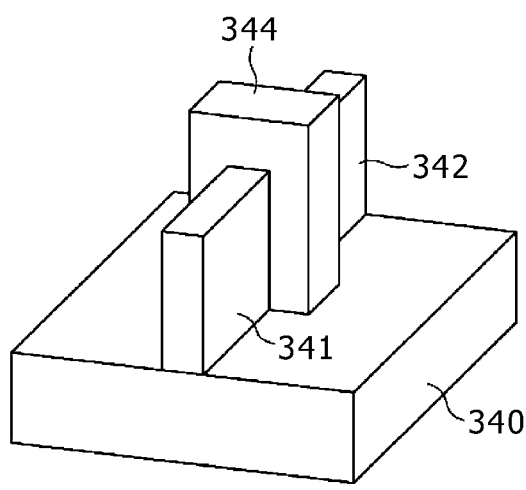
FIGS. 18A and 18B are schematic views showing a fin-structure field-effect transistor.
Figure 18B:
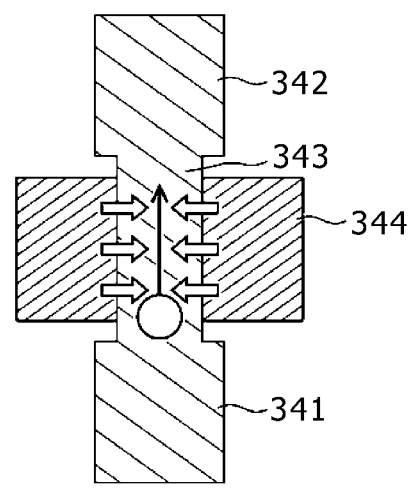

Explained next in reference to FIG. 16 is an application of the solid-state imaging device 100 as the fourth embodiment of the present disclosure. FIG. 16 shows how the solid-state imaging device 100 is applied to an electronic apparatus 400. Examples of the electronic apparatus 400 include digital still cameras, cameras attached to mobile phones or other portable devices, scanners, and surveillance cameras. In the ensuing explanation, the electronic apparatus 400 is assumed to be a digital still camera.

The electronic apparatus 400 as the fourth embodiment is made up of a solid-state imaging device 100, an optical lens 210, a shutter device 211, a drive circuit 212, and a signal processing circuit 213.

The optical lens 210 causes the light from an object (incident light) to form an image on an imaging plane of the solid-state imaging device 100. This allows the solid-state imaging device 100 internally to accumulate signal charges over a predetermined time period.

The shutter device 211 controls the exposure time and light-blocking time of the solid-state imaging device 100. The drive circuit 212 supplies drive signals for controlling transfer operations of the solid-state imaging device 100 and shutter operations of the shutter device 211.

Based on a drive signal, the solid-state imaging device 100 outputs as an electrical signal the signal charge accumulated in the photoelectric conversion element PD.

The signal processing circuit 213 performs various signal processes. That is, the signal processing circuit 213 processes the electrical signal output from the solid-state imaging device 100 to generate a picture signal and outputs the generated signal to a storage medium such as a memory or to a monitor or the like, not shown.

As explained above, the electronic apparatus 400 of the fourth embodiment furnished with the solid-state imaging device 100 of the first embodiment enhances optical sensitivity and thereby improves the picture quality of the picture signal.

Although the preceding example showed the electronic apparatus 400 to be equipped with the solid-state imaging device 100 of the third embodiment, this is not limitative of the present disclosure. Alternatively, the electronic apparatus 400 may be furnished with a solid-state imaging device incorporating the field-effect transistor of the first variation or of the second embodiment.

Although the preceding description showed the solid-state imaging device 100 to be provided with the field-effect transistor 1, this is not limitative of the present disclosure. Alternatively, other circuits of the electronic apparatus 400 such as the signal processing circuit 213 may incorporate the field-effect transistor of the first embodiment, of the second embodiment, or of the first variation.

It should be understood by those skilled in the art that various modifications, combinations, sub-combinations and alterations may occur depending on design requirements and other factors in so far as they are within the scope of the appended claims or the equivalents thereof.

The present technology contains subject matter related to that disclosed in Japanese Priority Patent Application JP 2011-054467 filed in the Japan Patent Office on Mar. 11, 2011, the entire content of which is hereby incorporated by reference.

What is claimed is:

1. A field-effect transistor comprising:
   a substrate;
   a semiconductor layer configured to be formed on said substrate and have a fin region with a source region and a drain region formed at both ends of said fin region; and
   a gate electrode configured to have a convex portion partially in contact with at least two faces of said fin region.

2. The field-effect transistor according to claim 1, wherein said convex portion of said gate electrode is formed to surround said fin region and be partially in contact with said fin region with a gate insulating film interposed therebetween; and
   said fin region has a nanowire structure including a first wire portion in contact with said convex portion of said gate electrode and a second wire portion not in contact with said convex portion of said gate electrode, said first wire portion being smaller in diameter than said second wire portion.

3. The field-effect transistor according to claim 1, wherein said convex portion of said gate electrode has a tapered shape such that a first face of said convex portion in contact with said fin region is smaller in width than a second face of said convex portion opposite to said first face.

4. A field-effect transistor manufacturing method comprising:
   manufacturing a semiconductor layer having a fin region formed on a substrate with a source region and a drain region formed at both ends of said fin region;
   manufacturing a film having an etching selection ratio with respect to said semiconductor layer so that said film is in contact with at least two faces of said fin region;
   manufacturing an opening so that at least two faces of said fin region of said film are partially exposed; and
   manufacturing a gate electrode in contact with said fin region with said film interposed therebetween.

5. The field-effect transistor manufacturing method according to claim 4, further comprising:
   removing by etching the substrate in contact with said fin region so that a perimeter of said fin region is exposed after said semiconductor layer has been manufactured; and
   etching partially the perimeter of said fin region using said film having said opening as a mask;
   wherein said film is manufactured so as to be in contact with the exposed faces of said fin region, and
   said opening is manufactured so that the perimeter of said fin region is partially exposed.

6. The field-effect transistor manufacturing method according to claim 4, wherein said opening is manufactured to have a tapered shape such that a first face of said opening in contact with said fin region is smaller in width than a second face of said opening opposite to said first face.

7. The field-effect transistor manufacturing method according to claim 4, further comprising
   removing said film.

8. A solid-state imaging device comprising:
   a pixel portion configured to generate a signal charge by having incident light received and subjected to photoelectric conversion; and
   a peripheral circuit configured to output said signal charge;
   wherein at least either said pixel portion or said peripheral circuit has a field-effect transistor including:
      a substrate,
      a semiconductor layer configured to be formed on said substrate and have a fin region with a source region and a drain region formed at both ends of said fin region, and
      a gate electrode configured to have a convex portion partially in contact with at least two faces of said fin region.

9. An electronic apparatus comprising:
   a solid-state imaging device including
      a pixel portion configured to generate a signal charge by having incident light received and subjected to a photoelectric conversion, and
      a peripheral circuit configured to output said signal charge,
      wherein at least either said pixel portion or said peripheral circuit has a field-effect transistor including
         a substrate,
         a semiconductor layer configured to be formed on said substrate and have a fin region with a source region and a drain region formed at both ends of said fin region, and
         a gate electrode configured to have a convex portion partially in contact with at least two faces of said fin region;
   an optical lens configured to guide said incident light to said photoelectric conversion portion; and
   a signal processing circuit configured to process an electrical signal.

* * * * *